United States Patent
Park et al.

(10) Patent No.: US 10,529,790 B2
(45) Date of Patent: Jan. 7, 2020

(54) ORGANIC LIGHT-EMITTING DIODE DISPLAY AND METHOD OF MANUFACTURING THE SAME WITH NO CLADDING PROCESS

(71) Applicant: Samsung Display Co., Ltd., Yongin-si, Gyeonggi-do (KR)

(72) Inventors: Kyung Hoon Park, Suwon-si (KR); Chun Gi You, Asan-si (KR); Sun Park, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 121 days.

(21) Appl. No.: 14/836,643

(22) Filed: Aug. 26, 2015

(65) Prior Publication Data

US 2016/0218165 A1 Jul. 28, 2016

(30) Foreign Application Priority Data

Jan. 23, 2015 (KR) .................. 10-2015-0011566

(51) Int. Cl.
*H01L 27/32* (2006.01)
*H01L 51/56* (2006.01)
*H01L 23/00* (2006.01)

(52) U.S. Cl.
CPC ...... *H01L 27/3276* (2013.01); *H01L 27/3258* (2013.01); *H01L 51/56* (2013.01);
(Continued)

(58) Field of Classification Search
CPC .. H01L 27/3276; H01L 25/18; H01L 27/3258
(Continued)

(56) References Cited

U.S. PATENT DOCUMENTS

2002/0024096 A1* 2/2002 Yamazaki ............... H01L 27/32
257/359
2005/0285100 A1* 12/2005 Jeong ................ H01L 27/3246
257/40
(Continued)

FOREIGN PATENT DOCUMENTS

KR 10-0472853 B1 2/2005
KR 10-0603844 B1 7/2006
(Continued)

*Primary Examiner* — Lex H Malsawma
*Assistant Examiner* — Eric W Jones
(74) *Attorney, Agent, or Firm* — F. Chau & Associates, LLC

(57) ABSTRACT

An organic light-emitting diode (OLED) display and a method of manufacturing an OLED display are disclosed. In one aspect, the method includes forming a data electrode layer and patterning the data electrode layer so as to form a source electrode, a drain electrode, and a pad electrode. The method can also include forming a first organic insulating layer over the source, drain and pad electrodes and forming a via hole corresponding to the source electrode or the drain electrode in the first organic insulating layer via a one tone mask. The method can further include forming an OLED including an anode electrically connected to the source electrode or the drain electrode, an organic emission layer, and a cathode, and etching a first portion of the first organic insulating layer formed over the pad electrode and a second portion of the organic emission layer formed over the pad electrode.

13 Claims, 6 Drawing Sheets

(52) U.S. Cl.
CPC .............. *H01L 24/16* (2013.01); *H01L 24/29* (2013.01); *H01L 24/32* (2013.01); *H01L 2224/16148* (2013.01); *H01L 2224/293* (2013.01); *H01L 2224/2929* (2013.01); *H01L 2224/32145* (2013.01); *H01L 2224/73204* (2013.01); *H01L 2224/8148* (2013.01); *H01L 2224/81424* (2013.01); *H01L 2224/81447* (2013.01); *H01L 2224/81466* (2013.01); *H01L 2224/81471* (2013.01); *H01L 2224/81903* (2013.01); *H01L 2224/83851* (2013.01); *H01L 2227/323* (2013.01); *H01L 2251/558* (2013.01); *H01L 2924/12044* (2013.01); *H01L 2924/14* (2013.01)

(58) Field of Classification Search
USPC ..................................................... 257/40, 59
See application file for complete search history.

(56) References Cited

U.S. PATENT DOCUMENTS

| | | | | |
|---|---|---|---|---|
| 2006/0113900 | A1* | 6/2006 | Oh | H01L 27/3276 313/504 |
| 2006/0186413 | A1* | 8/2006 | Sakakura | H01L 29/78654 257/72 |
| 2007/0024181 | A1* | 2/2007 | Oh | H01L 27/3258 313/500 |
| 2007/0170846 | A1* | 7/2007 | Choi | H01L 51/5246 313/504 |
| 2009/0302751 | A1* | 12/2009 | Hanawa | H01L 27/3276 313/504 |
| 2011/0315968 | A1* | 12/2011 | Nowatari | H01L 51/0078 257/40 |
| 2012/0068185 | A1* | 3/2012 | Kim | H01L 27/3244 257/72 |
| 2012/0146030 | A1* | 6/2012 | You | H01L 27/124 257/59 |
| 2014/0027765 | A1* | 1/2014 | Toyotaka | H01L 27/1225 257/43 |
| 2014/0374732 | A1* | 12/2014 | Jeong | H01L 27/3246 257/40 |
| 2015/0060806 | A1* | 3/2015 | Park | H01L 51/5253 257/40 |

FOREIGN PATENT DOCUMENTS

| | | |
|---|---|---|
| KR | 10-0883291 B1 | 2/2009 |
| KR | 10-2013-0007053 A | 1/2013 |
| KR | 10-1232547 B1 | 2/2013 |

\* cited by examiner

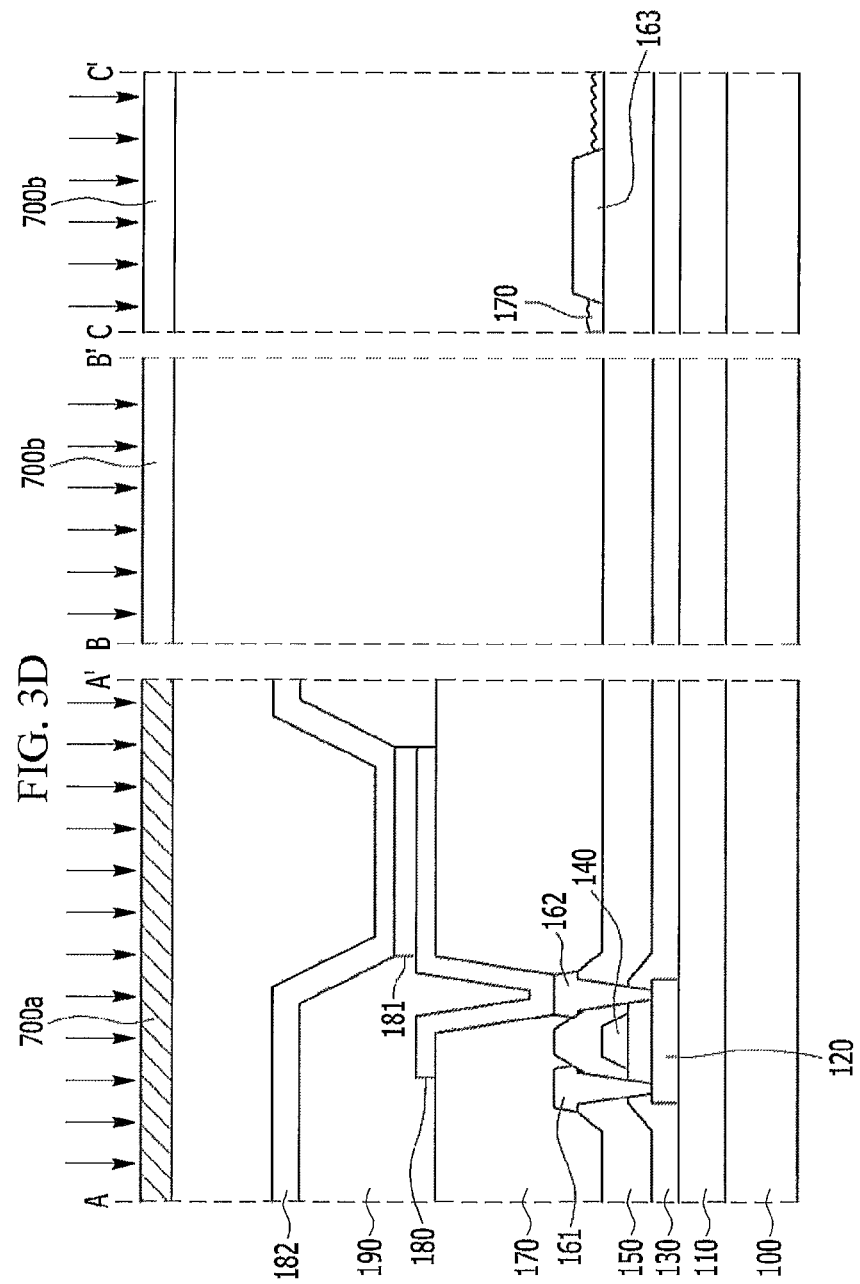

ORGANIC LIGHT-EMITTING DIODE DISPLAY AND METHOD OF MANUFACTURING THE SAME WITH NO CLADDING PROCESS

CROSS-REFERENCE TO RELATED APPLICATION

This application claims priority to and the benefit of Korean Patent Application No. 10-2015-0011566 filed in the Korean Intellectual Property Office on Jan. 23, 2015, the entire contents of which are incorporated herein by reference.

BACKGROUND

Field

The described technology generally relates to an organic light-emitting diode display and a manufacturing method thereof.

Description of the Related Technology

Organic light-emitting diode (OLED) displays have favorable characteristics such as wide viewing angles, excellent contrast ratios, and rapid refresh rates compared to liquid crystal displays (LCDs).

An OLED display panel includes pad electrodes to be connected with an external mounted component such as a driving integrated circuit (IC).

SUMMARY OF CERTAIN INVENTIVE ASPECTS

One inventive aspect relates to an OLED display including a pad portion which is not corroded without a cladding process and a manufacturing method thereof.

Another aspect is a manufacturing method of the OLED display including: stacking a data electrode layer; forming a source electrode, a drain electrode, and a pad electrode by patterning the data electrode layer; stacking a first organic insulating layer on the source electrode, the drain electrode, and the pad electrode; forming a via hole corresponding to the source electrode or the drain electrode in the first organic insulating layer by using a one tone mask; forming an OLED of which an anode is electrically connected to the source electrode or the drain electrode and including an organic emission layer and a cathode; and etching a portion of the first organic insulating layer covering the pad electrode and a remaining organic material.

The forming of the OLED can include: forming the anode; stacking and etching a second organic insulating layer so that the anode is exposed; stacking the organic emission layer on the anode; and stacking the cathode on the organic emission layer and the second organic insulating layer.

In the forming of the via hole, the portion of the first organic insulating layer covering the pad electrode can be maintained.

When the organic emission layer is formed, the remaining organic material can be formed on a seal line region and on the portion of the first organic insulating layer covering the pad electrode.

In the etching, a difference between a height of the first organic insulating layer around the pad electrode and a height of the pad electrode can be 1.5 μm or less.

In the etching, the first organic insulating layer can be etched so that the height of the first organic insulating layer around the pad electrode is smaller than the height of the pad electrode, and the pad electrode can be projected.

An etching method used in the etching can be dry etching. The dry etching can be plasma etching.

Another aspect is a method of manufacturing an organic light-emitting diode (OLED) display, comprising: forming a data electrode layer; patterning the data electrode layer so as to form a source electrode, a drain electrode, and a pad electrode; forming a first organic insulating layer over the source, drain and pad electrodes; forming a via hole corresponding to the source electrode or the drain electrode in the first organic insulating layer via a one tone mask; forming an OLED including i) an anode electrically connected to the source electrode or the drain electrode, ii) an organic emission layer and iii) a cathode; and etching a first portion of the first organic insulating layer formed over the pad electrode and a second portion of the organic emission layer formed over the pad electrode.

In the above method, the forming of the OLED includes: forming the anode; forming a second organic insulating layer; etching a portion of the second organic insulating layer so that the anode is exposed via the etched portion; forming the organic emission layer over the anode; and forming the cathode over the organic emission layer and the second organic insulating layer.

In the above method, the forming of the via hole includes maintaining the first portion.

In the above method, the second portion is formed over a seal line region and the first portion.

In the above method, the difference between the height of the first organic insulating layer around the pad electrode and the height of the pad electrode is about 1.5 μm or less.

In the above method, the first organic insulating layer is etched such that the height of the first organic insulating layer around the pad electrode is less than the height of the pad electrode.

In the above method, the etching includes dry etching.

In the above method, the dry etching includes plasma etching.

The above method further comprises forming a driving integrated circuit over the pad electrode and the first portion.

Another aspect is an organic light-emitting diode (OLED) display, comprising: a substrate including a display area and a non-display area surrounding the display area; source and drain electrodes formed over the display area; a pad electrode formed over the non-display area; a first organic insulating layer formed over the source electrode and contacting the drain and pad electrodes; and a via hole corresponding to the source or drain electrode formed in the first organic insulating layer.

In the above OLED display, the forming of the OLED includes: an anode electrically connected to the source or drain electrode; an organic emission layer formed over the anode; a second organic insulating layer formed over the anode and the first organic insulating layer; and a cathode formed over the organic emission layer and the second organic insulating layer.

In the above OLED display, the second portion is formed over a seal line region located between the display area and the non-display area.

In the above OLED display, the difference between the height of the first organic insulating layer around the pad electrode and the height of the pad electrode is about 1.5 μm or less.

In the above OLED display, the height of the first organic insulating layer around the pad electrode is less than the height of the pad electrode.

The above OLED display further comprises a driving integrated circuit formed over the pad electrode and a portion of the first organic insulating layer contacting the pad electrode.

Another aspect is a method of manufacturing an organic light-emitting diode (OLED) display, comprising: forming source, drain and pad electrodes; forming a first organic insulating layer over the source, drain and pad electrodes; forming a via hole corresponding to the source or drain electrode in the first organic insulating layer via a one tone mask; and etching a first portion of the first organic insulating layer formed over the pad electrode and a second portion of the organic emission layer formed over the pad electrode.

The above method further comprises forming an OLED, wherein the forming of the OLED includes: forming an anode; forming a second organic insulating layer; etching a portion of the second organic insulating layer so the anode is exposed via the etched portion; forming an organic emission layer over the anode; and forming a cathode over the organic emission layer and the second organic insulating layer.

In the above method, the forming of the via hole includes maintaining the first portion.

In the above method, the second portion is formed over a seal line region and the first portion.

In the above method, the difference between the height of the first organic insulating layer around the pad electrode and the height of the pad electrode is about 1.5 µm or less.

According to at least one of the disclosed embodiments, it is possible to provide an OLED display including a pad portion which does not corrode without a cladding process and a manufacturing method thereof.

BRIEF DESCRIPTION OF THE DRAWINGS

FIGS. 3A, 3B, 3C and 3D are diagrams for describing a manufacturing method of the OLED display of FIG. 1.

DETAILED DESCRIPTION OF CERTAIN INVENTIVE EMBODIMENTS

Figure 1:
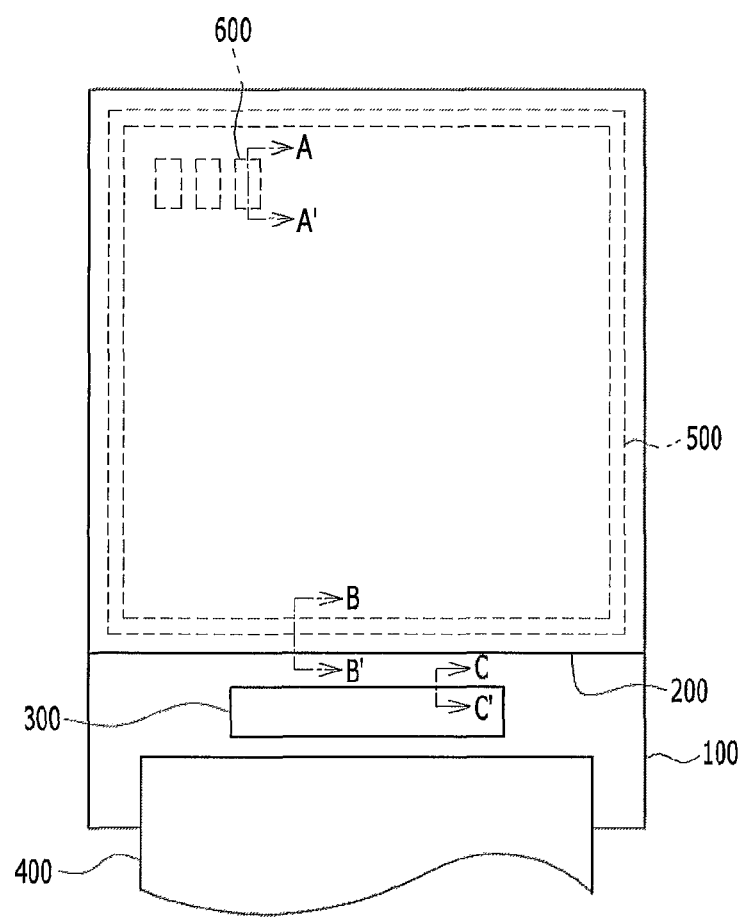
FIG. 1 is a diagram illustrating a display panel of an OLED display according to an exemplary embodiment of the described technology.

Generally, a pad electrode for an OLED display is formed of a conductive material (Mo/Al/Mo) having low resistance but low resistance to corrosion. A low corrosive metal such as indium tin oxide (ITO) and indium zinc oxide (IZO) is clad on the pad electrode. As a result, in wet, cleaning, and like process steps which are performed after forming the pad electrode, the corrosion can be prevented.

However, cladding requires use of an additional mask and a resultant increase in manufacturing cost.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
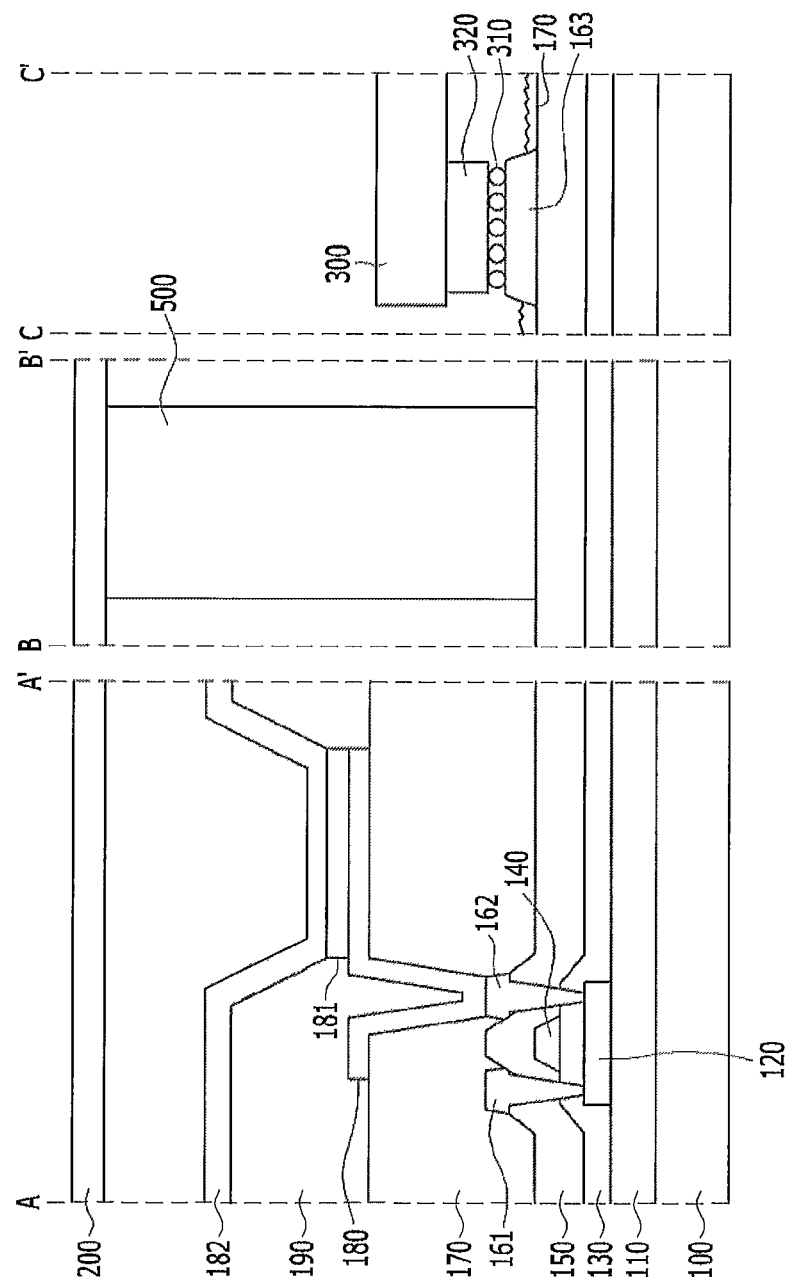
FIG. 2 is a cross-sectional view of the display panel of FIG. 1 taken along lines A-A', B-B', and C-C'.

FIG. 1 is a diagram illustrating a display panel of an OLED display according to an exemplary embodiment. FIG. 2 is a cross-sectional view of the display panel of FIG. 1 taken along lines A-A', B-B', and C-C'.

Referring to FIGS. 1 and 2, the display panel includes a first substrate 100, a second substrate 200, a driving IC 300, and a flexible printed circuit (FPC) 400.

The first substrate 100 is a substrate on which a plurality of OLEDs and corresponding thin film transistors are formed, and can be formed of a plastic material such as glass or polyimide and the like.

A buffer layer 110 is stacked on the first substrate 100. The buffer layer 110 can be formed of an inorganic material such as silicon oxide (SiOx) and silicon nitride (SiNx) and can be a single layer or a multilayer.

The buffer layer 110 serves to prevent impurity, oxygen, moisture, and the like from permeating the surface. The buffer layer 110 also planarizes the surface.

The semiconductor layer 120 is stacked on the buffer layer 110. The semiconductor layer 120 can be formed of polycrystalline silicon, and include a channel region, a source region, and a drain region.

The channel region can be formed of polysilicon on which impurity is not doped, that is, an intrinsic semiconductor, and the source region and the drain region can be formed at both sides of the channel region and impurity semiconductors in which impurities are doped.

A gate insulating layer 130 is stacked on the semiconductor layer 120. The gate insulating layer 130 can be formed of an inorganic material such as silicon oxide (SiOx) and silicon nitride (SiNx) and can be a single layer or a multilayer.

The gate electrode 140 is formed to correspond to the channel region of the semiconductor layer 120, on the gate insulating layer 130. The gate electrode 140 can be formed of a single or two or more kinds of conductive materials.

An interlayer insulating layer 150 is stacked on the gate electrode 140. The interlayer insulating layer 150 can be formed of an inorganic material such as silicon oxide (SiOx) and silicon nitride (SiNx) and can be configured by a single layer or a multilayer.

Via holes exposing the source region and the drain region of the semiconductor layer 120, respectively, are formed in the interlayer insulating layer 150 and the gate insulating layer 130.

On the interlayer insulating layer 150, a source electrode 161 connected to the source region through the via hole and a drain electrode 162 connected to the drain region through the via hole are formed.

Further, referring to a cross section taken along line C-C', the pad electrode 163 is formed on the interlayer insulating layer 150.

The source electrode 161, the drain electrode 162, and the pad electrode 163 can be formed of the same conductive material, and copper (Cu), aluminum (Al), molybdenum (Mo), chromium (Cr), titanium (Ti), and the like or alloys thereof can be formed in a single-layered or multilayered structure.

A first organic insulating layer 170 is stacked on the source electrode 161 and the drain electrode 162. The first organic insulating layer 170 is formed around the pad electrode 163.

The first organic insulating layer 170 can include a photoresist.

The first organic insulating layer 170 includes a via hole exposing the drain electrode 162.

Depending on whether the thin film transistor is a P type or an N type, a via hole exposing the source electrode 161 rather than the drain electrode 162 can be formed.

On the first organic insulating layer 170, an anode 180 of the OLED is formed. On the anode 180, an organic emission layer 181 and a cathode 182 are sequentially stacked to form the OLED.

In some embodiments, the anode 180 is formed on the first organic insulating layer 170, but is not limited thereto.

For example, the anode 180 is patterned once and formed with the same metal as the source electrode 161 and the drain electrode 162, and in this case, the anode 180 is formed on the gate insulating layer 130 or on the interlayer insulating layer 150.

As another example, the anode 180 is patterned once and formed with the same metal as the gate electrode 140.

Further, depending on an applied voltage, the layout of the anode 180 and the cathode 182 can be reversed.

Accordingly, in the described technology, there is no limitation on a stacking structure for electric connection between the OLED and the thin film transistor.

The anode 180 can be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The second organic insulating layer 190 surrounds an edge of the anode 180 and is formed on the first organic insulating layer 170. The second organic insulating layer 190 is called a pixel defining layer partitioning a light emission area of the OLED.

The second organic insulating layer 190 can be formed by resin such as polyacrylates or polyimides.

The organic emission layer 181 is formed on the anode 180 which is the light emission area partitioned by the second organic insulating layer 190.

The organic emission layer 181 can include a single layer or a multilayer including one or more of an emission layer, a hole-injection layer (HIL), a hole-transporting layer (HTL), an electron-transporting layer (ETL), and an electron-injection layer (EIL).

In the case where the organic emission layer 181 includes all the layers, the HIL is positioned on the anode 180, and the HTL, the emission layer, the ETL, and the EIL can be sequentially stacked thereon.

The organic emission layer 181 can include red, green and blue organic emission layers respectively emitting red, green and blue light. The red, green and blue organic emission layers are respectively formed in a red pixel, a green pixel, and a blue pixel, thereby implementing a color image.

Further, in the organic emission layer 181, all of the red, green and blue organic emission layers are together stacked on the red, green and blue pixels. Red, green and blue color filters are formed for each pixel, thereby implementing a color image. As another example, white organic emission layers emitting white light are formed on the red, green and blue pixels, and red, green and blue color filters are formed for each pixel, thereby implementing the color image. In the case of implementing the color image by using the white organic emission layer and the color filters, it is not required to use a deposition mask for depositing the red, green and blue organic emission layers on respective pixels, that is, the red, green and blue pixels.

The white organic emission layer can be formed by one organic emission layer, and also includes a configuration formed so as to emit white light by stacking a plurality of organic emission layers. For example, the white organic emission layer includes a configuration which can emit white light by combining at least one yellow organic emission layer and at least one blue organic emission layer, a configuration which can emit white light by combining at least one cyan organic emission layer and at least one red organic emission layer, a configuration which can emit white light by combining at least one magenta organic emission layer and at least one green organic emission layer, and the like.

The cathode 182 is formed on the second organic insulating layer 190 and the organic emission layer 181. The cathode 182 can be formed of a transparent conductive material such as ITO, IZO, ZnO, or $In_2O_3$, or a reflective metal such as lithium, calcium, lithium fluoride/calcium, lithium fluoride/aluminum, aluminum, silver, magnesium, or gold.

Referring to a seal line region which is a region of line B-B', a seal line 500 is formed on the interlayer insulating layer 150 to assemble and encapsulate the first substrate 100 and the second substrate 200.

In some embodiments, the seal line 500 is formed on the interlayer insulating layer 150, but can also be formed on the first substrate 100, on the buffer layer 110, on the gate insulating layer 130, or the like. Accordingly, a formation position of the seal line 500 is not limited to the described technology.

Referring to a pad region which is a region of C-C' line, the driving IC 300 includes a bump 320, and the bump 320 is electrically connected to the pad electrode 163 through a plurality of conductive balls 310.

The conductive balls 310 can be included and coated on an anisotropic conductive film (ACF).

In FIG. 2, a height of the first organic insulating layer 170 around the pad electrode 163 is formed to be lower than a height of the pad electrode 163. However, the height of the first organic insulating layer 170 can be formed to be larger than the height of the pad electrode 163, and in this case, a difference between the height of the first organic insulating layer 170 and the height of the pad electrode 163 can be formed to be smaller than a diameter of the conductive ball 310. The difference can vary according to a diameter and a characteristic of the conductive balls 310, but generally, the difference in height can be about 1.5 µm or less. However, depending on the embodiments, the difference in height can be greater than about 1.5 µm.

The driving IC 300 can be one of a data driving IC and a gate driving IC, or can include both the data driving IC and the gate driving IC. Further, the driving IC 300 can further include a power supplying unit. The layout position and the configuration of the driving IC 300 illustrated in FIG. 1 are exemplified, and the described technology is not limited thereto.

A flexible printed circuit (FPC) 400 serves to apply an external signal to a display panel and can be electrically connected to another portion (not illustrated) of the driving IC 300.

FIGS. 3A-3D are diagrams for describing a manufacturing method of the OLED display of FIG. 1.

Figure 3A:
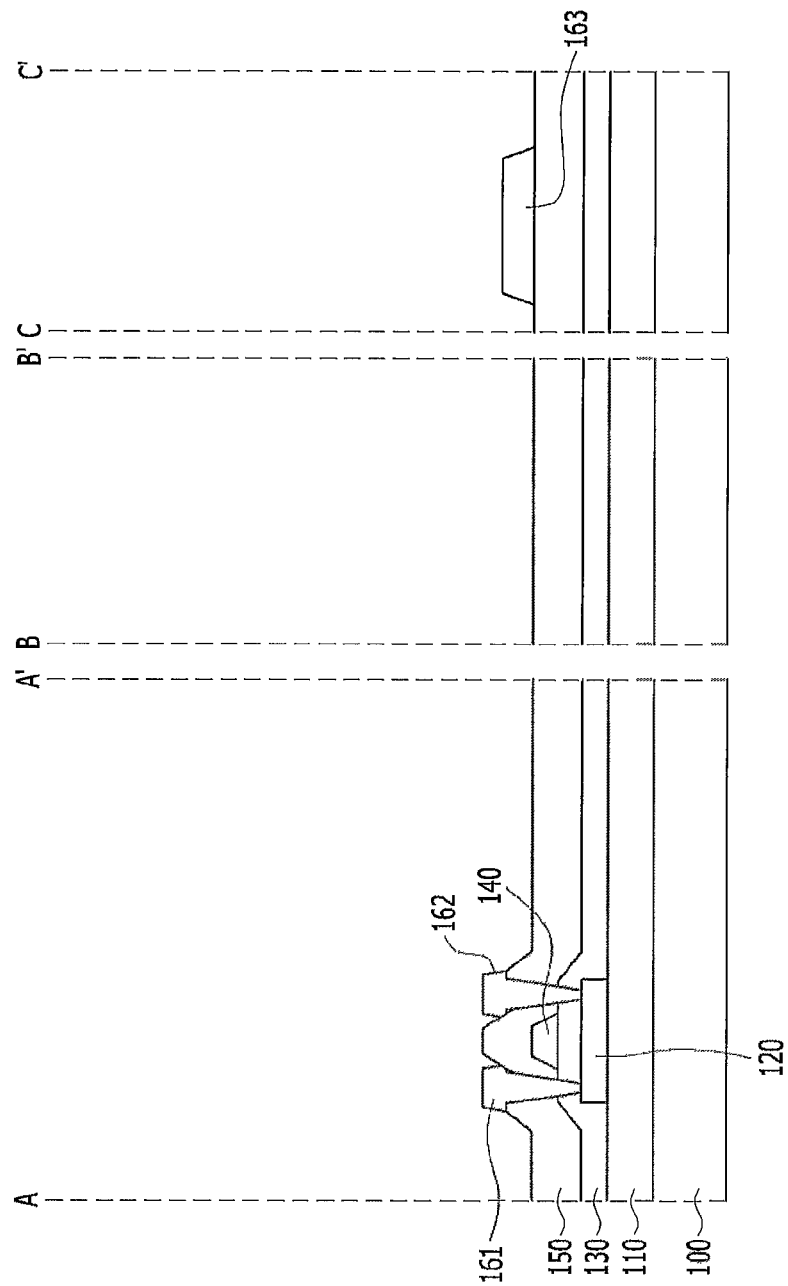

Referring to FIG. 3A, the thin film transistor and the pad electrode 163 are formed.

The buffer layer 110 which prevents impurity from permeating the surface and planarizes the surface is formed on the first substrate 100.

The semiconductor layer 120 of the thin film transistor is formed on the buffer layer 110. The semiconductor layer 120 can be formed of polycrystalline silicon and patterned by using a first mask.

The gate insulating layer 130 is formed on the semiconductor layer 120. The gate insulating layer 130 can deposit an inorganic insulating layer such as silicon oxide and silicon nitride by a method such as a PECVD method, an APCVD method, and an LPCVD method.

The gate electrode 140 is formed on the gate insulating layer 130 by using a second mask.

The gate electrode 140 can be include a single layer or a multilayer formed of a transparent material such as ITO, IZO, ZnO, or $In_2O_3$ or a material such as Ag, Mg, Al, Pt, Pd, Au, Ni, Nd, Ir, Cr, Li, Ca, Mo, Ti, W, MoW, or Al/Cu.

An n type or p type impurity can be doped according to a kind of thin film transistor by using the gate electrode 140 as a mask. The semiconductor layer 120 covered by the gate electrode 140 becomes a channel region, and an edge portion which is not covered by the gate electrode 140 becomes a source region and a drain region.

The interlayer insulating layer 150 is formed on the gate electrode 140. The interlayer insulating layer 150 can be formed by spin-coating one or more organic insulating materials such as polyimide, polyamide, acrylic resin, benzocyclobutene, and phenol resin, (this can be a closed group) and can be formed to be larger than the aforementioned gate insulating layer 130 in thickness to insulate the gate electrode 140 and the source/drain electrodes 161 and 162 of the thin film transistor from each other. Further, the interlayer insulating layer 150 can be formed on an organic insulating material and an inorganic insulating material such as silicon oxide and silicon nitride, and can also be formed by alternating the organic insulating material and the inorganic insulating material.

In the interlayer insulating layer 150 and the gate insulating layer 130, via holes corresponding to the source region and the drain region of the semiconductor layer 120 are formed by using a third mask.

A data electrode layer is deposited on the interlayer insulating layer 150, and the data electrode layer is patterned by using a fourth mask to form the source electrode 161, the drain electrode 162, and the pad electrode 163.

The data electrode layer can be formed of the same material as the gate electrode 140. The data electrode layer can be formed of a Mo/Al/Mo material.

As described above, when the data electrode layer is formed of a material having low resistance and high corrosion such as Mo/Al/Mo, in order to prevent corrosion in a wet process and a cleaning process which is a subsequent process, a cladding process was performed in the related art.

However, in the described technology, the first organic insulating layer 170 serves as a passivation layer of the pad electrode 163 and thus the cladding process is not required. Accordingly, since a separate mask used in the cladding process is not required, manufacturing costs can be reduced.

Figure 3B:
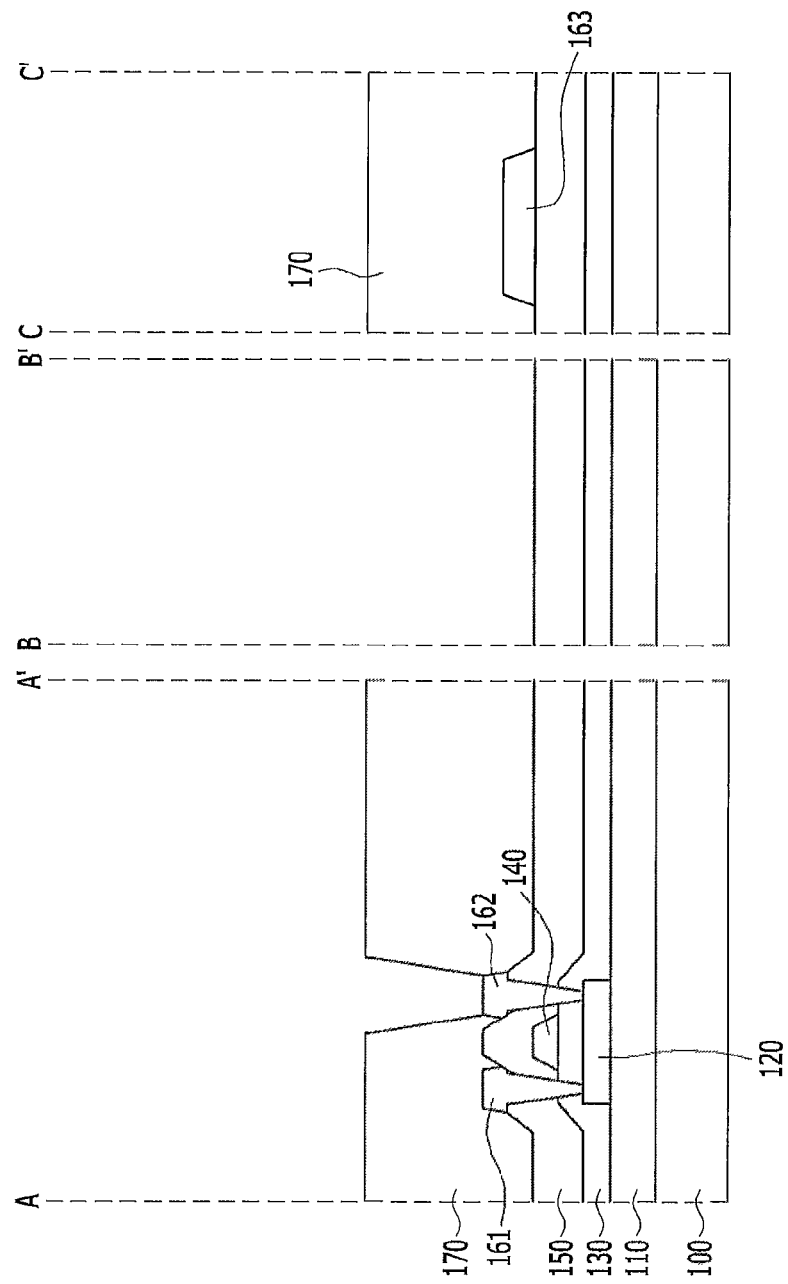

Referring to FIG. 3B, the first organic insulating layer 170 is stacked on the source electrode 161, the drain electrode 162, and the pad electrode 163.

In the first organic insulating layer 170, a via hole etched by using a fifth mask to expose the drain electrode 162 is formed.

In this case, the fifth mask uses a general one-tone mask, not a two-tone mask such as a half-tone mask, thereby reducing the manufacturing cost.

That is, in the existing process, in order to electrically connect the bump 320 and the pad electrode 163, the height of the first organic insulating layer 170 around the pad electrode 163 is decreased, and in order to prevent a parasitic capacitance, the height of the first organic insulating layer 170 on the thin film transistor needs to be increased, and as a result, the half-tone mask is required as the fifth mask.

However, in the described technology, in order to serve as the passivation layer of the pad electrode 163, since the etching of the first organic insulating layer 170 therearound is not required in a current step, the half-tone mask is not required. That is, in the forming of the via hole, the portion of the first organic insulating layer 170 covering the pad electrode 163 is maintained.

As a result, in the described technology, in a step of FIG. 3B, one of the number of masks is reduced when the cladding process is not performed, and the one-tone mask is used as the fifth mask to reduce the manufacturing cost.

Figure 3C:
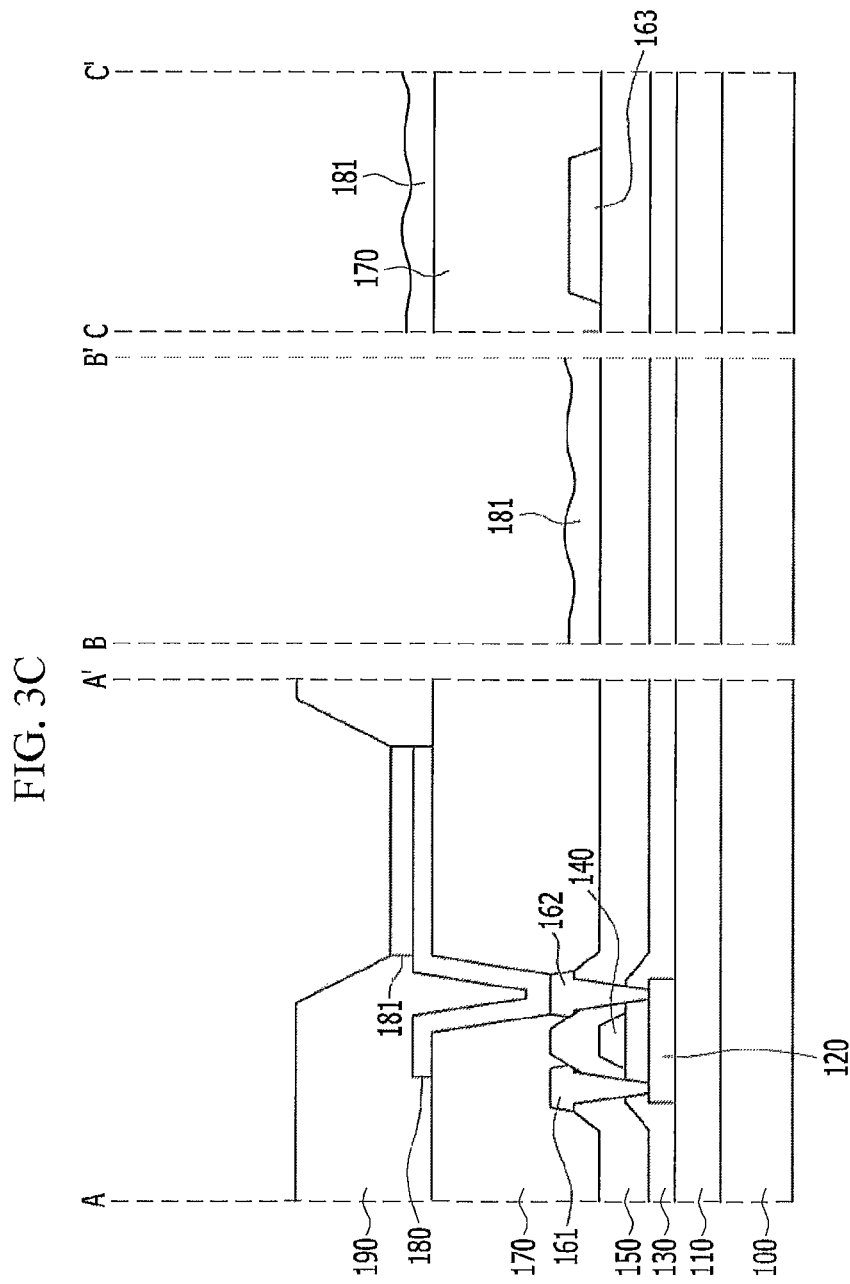

Referring to FIG. 3C, the anode 180 is deposited and patterned.

Next, the second organic insulating layer 190 is formed and etched on the first organic insulating layer 170 to expose the anode 180 and partition a light emission region.

Generally, a step of patterning the second organic insulating layer 190 is called a backplane (BP) process.

A process after the BP process is called an evaporation (EV) process.

In the EV process, first, a raw plate where a plurality of display panels is formed together is divided, and chamfering and cleaning processes are performed.

Thereafter, cleaning before depositing, and plasma treatment for oven and interface processing are performed, and the organic emission layer 181 is deposited.

The organic emission layer 181 is deposited so that one surface contacts the anode 180 through the patterned second organic insulating layer 190.

In this case, when the organic emission layer 181 is deposited, the mask is not separately used, or due to other processes, the remaining organic material 181 having the same configuration as the organic emission layer 181 can be deposited in the seal line region (B-B' line) and the pad electrode region (C-C').

Since the remaining organic material 181 becomes a problem to form the seal line 500, the remaining organic material 181 needs to be removed in order to ensure contact force. The removing process can be performed by dry etching, and will be described in detail in FIG. 3D.

Referring to FIG. 3D, after the deposition process of the organic emission layer 181, the cathode 182 is deposited and patterned.

Next, a plasma etching process for removing the remaining organic material 181 is performed by using a plasma mask. A pixel area 600 which does not need to be etched is covered by a blocking portion 700a of the plasma mask and opened by an opening 700b of the plasma mask in the seal line region and the pad electrode region. The pixel area 600 can be a display area and the regions outside the pixel area 600 can be a non-display area of the OLED display.

In the related art, the remaining organic material 181 of the seal line region and the pad electrode region is removed, but in the described technology, the first organic insulating layer 170 to be etched in the pad electrode region (C-C') is etched together. In this case, the pad electrode 163 can be prevented from being damaged by adjusting etch selectivity.

In this case, the first organic insulating layer 170 needs to be etched so that the pad electrode 163 is sufficiently exposed. Accordingly, electrical connection of the bump 320 and the pad electrode 163 can be ensured.

The difference between the height of the first organic insulating layer 170 around the pad electrode 163 and the height of the pad electrode 163 need to be sufficiently smaller than the diameter of the conductive ball 310, and can be generally about 1.5 μm or less. However, depending on the embodiments, the difference can be greater than about 1.5 μm.

Alternatively, the height of the first organic insulating layer 170 around the pad electrode 163 is etched to be smaller than the height of the pad electrode 163, and like FIG. 3D, the pad electrode 163 can have a projected shape.

The drawings referred to in the above and disclosed description of the described technology only illustrate the described technology, and are intended to describe the described technology, not to restrict the meanings or the scope of the described technology claimed in the claims. Therefore, it will be appreciated by those skilled in the art that various modifications and other equivalent embodiment can be made. Accordingly, the true technical scope of the present should be defined by the technical spirit of the appended claims.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light-emitting diode (OLED) display, comprising:
   forming a data electrode layer;
   patterning the data electrode layer so as to form a source electrode, a drain electrode, and a pad electrode;
   forming a first organic insulating layer over the source, drain and pad electrodes,
   wherein the first organic insulating layer includes a first portion over the pad electrode and a second portion over the source electrode and the drain electrode;
   forming a separation region in the first organic insulating layer between the pad electrode, and the source and drain electrodes;
   forming a via hole corresponding to the source electrode or the drain electrode in the first organic insulating layer via a one tone mask;
   forming an OLED including i) an anode electrically connected to the source electrode or the drain electrode, ii) an organic emission layer and iii) a cathode; and
   etching the first portion of the first organic insulating layer formed over the pad electrode and portion of the organic emission layer formed over the pad electrode after forming the OLED and after forming the separation region so that at least a whole of an upper horizontal surface of the pad electrode is exposed and the pad electrode is electrically connected to a driving integrated circuit (IC),
   wherein the first portion of the first organic insulating layer is etched such that the height of the first portion of the first organic insulating layer around the pad electrode is less than the height of the pad electrode.

2. The method of claim 1,
   wherein the forming of the OLED includes:
   forming the anode;
   forming a second organic insulating layer;
   etching a portion of the second organic insulating layer so that the anode is exposed via the etched portion;
   forming the organic emission layer over the anode; and
   forming the cathode over the organic emission layer and the second organic insulating layer.

3. The method of claim 1,
   wherein the forming of the via hole includes maintaining the first portion.

4. The method of claim 3,
   wherein the forming of the OLED includes forming the portion of the organic emission layer over a seal line region and the first portion, and
   wherein the seal line region is disposed in the separation region.

5. The method of claim 4,
   wherein the difference between the height of the first organic insulating layer around the pad electrode and the height of the pad electrode is about 1.5 μm or less.

6. The method of claim 1,
   wherein the etching includes dry etching.

7. The method of claim 6,
   wherein the dry etching includes plasma etching.

8. The method of claim 1, further comprising forming the driving IC over the pad electrode and the first portion.

9. A method of manufacturing an organic light-emitting diode (OLED) display, comprising:
   forming source, drain and pad electrodes;
   forming a first organic insulating layer over the source, drain and pad electrodes;
   forming a separation region in the first organic insulating layer between the pad electrode, and the source and drain electrodes;
   forming a via hole corresponding to the source or drain electrode in the first organic insulating layer via a one tone mask;
   forming an organic emission layer over the first organic insulating layer, wherein the organic emission layer includes a first portion disposed in the separation region and a second portion formed over the electrode; and
   etching a first portion of the first organic insulating layer formed over the pad electrode the first portion of the organic emission layer and the portion of the organic emission layer after forming the organic emission layer so that at least a whole of an upper horizontal surface of the pad electrode is exposed and the pad electrode is electrically connected to a driving IC,
   wherein the first organic insulating layer is etched such that the height of the first organic insulating layer around the pad electrode is less than the height of the pad electrode.

10. The method of claim 9, further comprising:
    forming an anode;
    forming a second organic insulating layer;
    etching a portion of the second organic insulating layer so the anode is exposed via the etched portion;
    forming an organic emission layer over the anode; and
    forming a cathode over the organic emission layer and the second organic insulating layer.

11. The method of claim 9,
wherein the forming of the via hole includes maintaining the first portion.

12. The method of claim 11,
wherein the first portion of the organic emission layer is formed over a seal line region disposed in the separation region and the first portion, and
wherein the forming of the OLED includes forming the first portion of the organic emission layer over the seal line region and the first portion.

13. The method of claim 12,
wherein the difference between the height of the first organic insulating layer around the pad electrode and the height of the pad electrode is about 1.5 μm or less.

* * * * *